United States Patent
Wang et al.

(10) Patent No.: US 10,659,070 B2
(45) Date of Patent: May 19, 2020

(54) DIGITAL TO ANALOG CONVERTER DEVICE AND CURRENT CONTROL METHOD

(71) Applicant: Realtek Semiconductor Corporation, Hsinchu (TW)

(72) Inventors: Wei-Chou Wang, Zhubei (TW); Hsiang-An Yang, New Taipei (TW); Jian-Ru Lin, Nantou County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/375,121

(22) Filed: Apr. 4, 2019

(65) Prior Publication Data
US 2020/0099385 A1    Mar. 26, 2020

(30) Foreign Application Priority Data
Sep. 21, 2018   (TW) .............................. 107133478 A (51) Int. Cl.
*H03M 1/10* (2006.01)
*H03M 1/06* (2006.01)

(52) U.S. Cl.
CPC ....... *H03M 1/1023* (2013.01); *H03M 1/0607* (2013.01)

(58) Field of Classification Search
CPC .......................... H03M 1/1023; H03M 1/0607
USPC .................................................. 341/118–147
See application file for complete search history.

(56) References Cited

U.S. PATENT DOCUMENTS

| 4,998,108 A * | 3/1991 | Ginthner | ................ H03M 1/68 341/142 |
| 5,661,483 A * | 8/1997 | Negahban | ............... H03M 1/46 341/156 |
| 6,970,121 B1 * | 11/2005 | Sun | ...................... G09G 3/3688 341/144 |
| 8,860,599 B1 * | 10/2014 | Lien | ........................ H03M 1/34 341/155 |
| 9,425,814 B1 * | 8/2016 | Verma | ................... H03M 7/165 |
| 10,320,411 B1 * | 6/2019 | Zhang | ..................... H03M 1/66 |
| 2006/0049971 A1 * | 3/2006 | Quilligan | ................ H03M 1/68 341/144 |
| 2009/0085782 A1 * | 4/2009 | Felder | ....................... G06F 3/14 341/110 |
| 2009/0086104 A1 * | 4/2009 | Felder | .................... H04N 5/268 348/705 |

(Continued)

OTHER PUBLICATIONS

Georgi I. Radulov et al., An on-chip self-calibration method for current mismatch in D/A Converters, Proceedings of ESSCIRC, Grenoble, France, 2005.

(Continued)

*Primary Examiner* — Lam T Mai
(74) *Attorney, Agent, or Firm* — Locke Lord LLP; Tim Tingkang Xia, Esq.

(57) ABSTRACT

A digital-to-analog converter (DAC) device includes a DAC circuitry. The DAC circuitry includes a first DAC circuit and a second DAC circuit. The first DAC circuit is configured to generate a first signal according to a plurality of least significant bits of an input signal. The second DAC circuit is configured to output a second signal according to a plurality of most significant bits of the input signal. A first turn-on time of at least one current source circuit in the first DAC circuit is configured to set the first signal.

20 Claims, 5 Drawing Sheets

(56) References Cited

U.S. PATENT DOCUMENTS

| | | | |
|---|---|---|---|
| 2013/0015989 A1* | 1/2013 | Iso | H03M 1/1061 |
| | | | 341/120 |
| 2014/0266839 A1* | 9/2014 | Cullinane | H03M 1/0673 |
| | | | 341/155 |
| 2015/0162933 A1* | 6/2015 | Girardi | H03M 1/001 |
| | | | 341/145 |
| 2018/0167078 A1* | 6/2018 | Ding | H03M 1/1033 |

OTHER PUBLICATIONS

Yusuke Ikeda et al., Digital Calibration Method for Binary-Weighted Current-Steering D/A-Converters without Calibration ADC, IEICE Trans. Electron., vol. E90-C, No. 6, 2007.

Meng-Hung Shen et al., A Low Cost Calibrated DAC for High-Resolution Video Display System, IEEE Transactions on Very Large Scale Integration (VLSI) Systems, vol. 20, No. 9, 2012.

\* cited by examiner

DIGITAL TO ANALOG CONVERTER DEVICE AND CURRENT CONTROL METHOD

RELATED APPLICATIONS

This application claims priority to Taiwan Application Serial Number 107133478, filed Sep. 21, 2018, which is herein incorporated by reference in its entirety.

BACKGROUND

Technical Field

The present disclosure relates to a digital to analog converter (DAC) device. More particularly, the present disclosure relates to the DAC device having a mechanism of controlling a turn-on time of a current source circuit.

Description of Related Art

Digital to analog converter (DAC) has been widely applied to various electronic devices. In related approaches, with the increasing of number of bits required to be processed, the number of circuits is increased, resulting in a significant increase in the circuit area.

SUMMARY

Some aspects of the present disclosure are related to a digital-to-analog converter (DAC) device, which includes a DAC circuitry. The DAC circuitry includes a first DAC circuit and a second DAC circuit. The first DAC circuit is configured to generate a first signal according to a plurality of least significant bits of an input signal. The second DAC circuit is configured to output a second signal according to a plurality of most significant bits of the input signal. A first turn-on time of at least one current source circuit in the first DAC circuit is configured to set the first signal.

Some aspects of the present disclosure are related to a current control method, which includes the following operations: processing digital data according to a system clock signal, in order to generate an input signal; and determining a turn-on time of at least one current source circuit in a digital-to-analog converter (DAC) circuit, in order to generate an analog signal, in which a ratio is present between the turn-on time and the system clock signal, and the ratio is configured to set the analog signal.

DETAILED DESCRIPTION

In this document, the term "circuitry" may indicate a system formed with one or more circuits. The term "circuit" may indicate an object, which is formed with one or more transistors and/or one or more active/passive elements based on a specific arrangement, for processing signals.

For ease of understanding, like elements in figures are designated with the same reference numbers.

Figure 1:
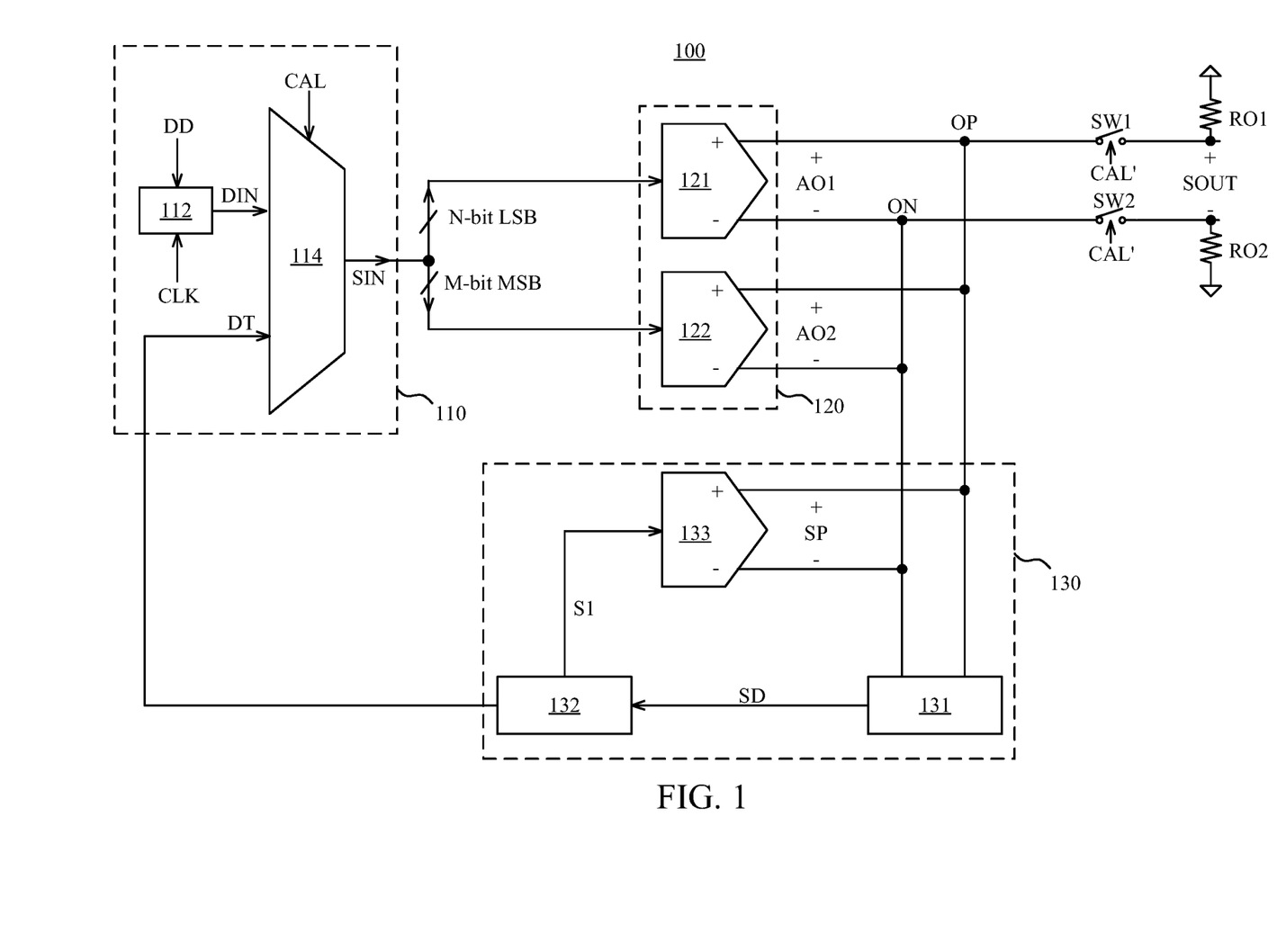
FIG. 1 is a schematic diagram of a digital-to-analog converter (DAC) device, according to some embodiments of the present disclosure.

FIG. 1 is a schematic diagram of a digital-to-analog converter (DAC) device 100, according to some embodiments of the present disclosure.

The DAC device 100 includes an input circuitry 110, a DAC circuitry 120, and a calibration circuitry 130. The input circuitry 110 includes a codec circuit 112 and a multiplexer circuit 114. The codec circuit 112 is configured to perform an encoding or decoding operation on digital data DD according to a system clock signal CLK, in order to generate a data signal DIN. In some embodiments, the above encoding or decoding operation corresponds to a circuit configuration of the DAC circuitry 120.

The multiplexer circuit 114 selectively outputs one of the data signal DIN or a testing signal DT as an input signal SIN according to a mode control signal CAL. For example, when the mode control signal CAL has a logic value of 0, the DAC device operates in a normal mode, and the input circuitry 110 outputs the data signal DIN as the input signal SIN. Alternatively, when the mode control signal CAL has a logic value of 1, the DAC device 100 operates in a calibration mode, and the input circuitry 110 outputs the testing signal DT as the input signal SIN.

The DAC circuitry 120 is coupled to the input circuitry 110 to receive the input signal SIN. The DAC circuitry 120 includes a DAC circuit 121, a DAC circuit 122, and resistors RO1-RO2. The DAC circuit 121 is configured to generate a signal AO1 according to N least significant bits (LSB) of the input signal SIN. The DAC circuit 122 is configured to generate a signal AO2 according to M most significant bits (MSB) of the input signal SIN.

In some embodiments, the DAC circuitry 120 may be implemented with a current-steering DAC circuit. The current-steering DAC may be implemented with unity current source circuits, which may be turned on according to the input signal SIN, in order to output a corresponding current signal as signal AO1 or AO2. The resistors RO1-RO2 are coupled to output terminals OP and ON of the DAC circuits 121 and 122, respectively, in order to convert a summation of the signals AO1 and AO2 into an analog output SOUT as a voltage signal.

In some embodiments, the DAC device 100 further includes switches SW1-SW2. The switches SW1-SW2 are coupled to the output terminals of the DAC circuitry 120 and the resistors RO1-RO2, respectively. When operating in the calibration mode, the switches SW1-SW2 are not conducted in response to a mode control signal CAL', which is an inverse of the mode control signal CAL. As a result, in the calibration mode, the signals AO1-AO2 can be transmitted to the detector circuit 131 correctly. Alternatively, when operating in the normal mode, the switches SW1-SW2 are conducted in response to the mode control signal CAL'. As a result, in the normal mode, the signals AO1-AO2 can be transmitted to the resistors RO1-RO2.

In some embodiments, the calibration circuitry 130 is coupled to the DAC circuitry 120, and is configured to calibrate the DAC circuit 122 based on the signals AO1 and AO2 in the calibration mode. In some embodiments, the calibration circuitry 130 includes the detector circuit 131, a digital controller circuit 132, and a calibration DAC circuit 133.

The detector circuit 131 is coupled to the output terminals OP and ON of the DAC circuits 121-122, in order to receive the signals AO1 and AO2. In some embodiments, the detector circuit 131 is configured to compare the signal AO1 with the signal AO2, in order to generate a detection signal SD. The detection signal SD is configured to indicate a comparison result of the signals AO1-AO2. In some embodiments, the detector circuit 131 may be implemented with a circuit, such as a current comparator or a quantizer, but the present disclosure is not limited thereto.

The digital controller circuit 132 is coupled to the input circuitry 110 and the detector circuit 131. In some embodiments, the digital controller circuit 132 is arranged with a memory (not shown), which is configured to store a predetermined testing signal DT, in order to provide the testing signal DT to the input circuitry 110 in the calibration mode. In some embodiments, the digital controller circuit 132 further performs a calibration algorithm in response to the detection signal SD, in order to generate a calibration signal S1. Operations regarding the calibration algorithm are described in subsequent paragraphs. In some embodiments, the digital controller circuit 132 may be implemented with a digital signal processing circuit, one or more logic circuits, and/or a processing circuit that performs a finite state machine, but the present disclosure is not limited thereto.

The DAC circuit 133 is coupled to the DAC circuit 122 and the digital controller circuit 132. In some embodiments, the DAC circuit 133 is configured to output a compensation signal SP according to the calibration signal S1, in order to calibrate the DAC circuit 122. For example, if the DAC circuit 122 is a current-steering DAC implemented with multiple unity current sources, the compensation signal SP may be directly inputted into the DAC circuit 122, in order to calibrate a bias signal of a corresponding unity current source. As a result, the signal AO2 outputted from the DAC circuit 122 can be calibrated equivalently.

Alternatively, as shown in FIG. 1, in some embodiments, the DAC circuit 133 is directly coupled to the outputs of the DAC circuit 122. Under this arrangement, the DAC circuit 133 may turn on a corresponding unity current source(s) thereof according to the calibration signal S1, in order to generate a corresponding current signal (i.e., a compensation signal SP) to the outputs terminals OP and ON of the DAC circuit 122. As a result, the compensation signal SP is directly summed up with the signal AO2, in order to calibrate an offset of the DAC circuit 122 equivalently.

In some embodiments, a turn-on time of at least one current source circuit in the DAC circuit 133 in controlled based on the calibration signal S1, in order to determine the compensation signal SR A ratio is present between the turn-on time and a period of the system clock signal CLK, in which the ratio is associated with the comparison result of the signals AO1-AO2. Detailed descriptions about this matter are described in subsequent paragraphs.

Figure 2:
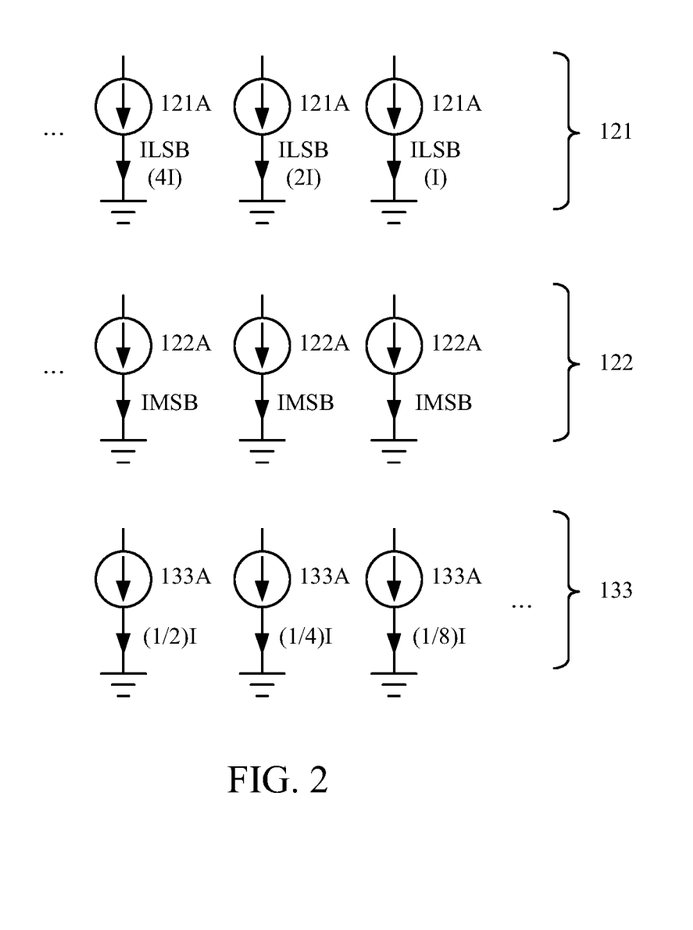
FIG. 2 is a schematic diagram illustrating arrangements of current source circuits in the DAC circuits in FIG. 1, according to some embodiments of the present disclosure.

FIG. 2 is a schematic diagram illustrating arrangements of current source circuits in the DAC circuits 121, 122, and 133 in FIG. 1, according to some embodiments of the present disclosure.

As described above, in some embodiments, the DAC circuits 121, 122, and 133 may be implemented with the current-steering DAC circuits. In these embodiments, a corresponding relation is present between multiple current source circuits 121A of the DAC circuit 121 for processing the LSB and multiple current source circuits 122A of the DAC circuit 122 for processing the MSB.

For example, if the LSB are encoded with binary code, and the MSB are encoded with thermometer code, currents of the current source circuits 121A (hereinafter referred to as "current ILSB") are different by 2 in sequence. For example, as shown in FIG. 2, the currents ILSB of the current source circuits 121A is increased from 1 I, to 2 I, 4 I, and so on.

As shown in FIG. 2, the DAC circuit 133 includes multiple current source circuits 133A, which have currents different by 2 in sequence (e.g., ½I, ¼I, and ⅛I). In some embodiments, a resolution of the DAC circuit 133 is higher than a resolution of the DAC circuit 122.

Ideally, a summation of the currents ILSB is expected to be equal to a current of a single current source circuit 122A (hereinafter referred to as "IMSB"). In other words, E ILSB=IMSB (hereinafter referred to as "equation 1"). However, an offset may be present in the current IMSB due to factor(s) including process variations, such that the equation 1 cannot be satisfied. In some embodiments, the DAC circuit 121 may further include an additional current source circuit having a current I. Under this condition, ΣILSB=IMSB.

Therefore, when operating in the calibration mode, the digital controller circuit 132 may output the testing signal DT having specific bit values. In an initial testing, all of low weighted bits (i.e., LSB) of the testing signal DT are 1, and a corresponding one of high weighted bits (i.e., MSB) of the testing signal DT is 1. Under this condition, all of current source circuits 121A are turned on to output all currents ILSB as the signal AO1, and a corresponding one of the current source circuits 122A is turned on to output a single current IMSB as the signal AO2. For example, all of the current source circuits 121A are turned on to output all currents ILSB to the output terminal OP, and a corresponding current source circuit 122A is turned on to output a single current IMSB to the output terminal ON. With this arrangement, the detector circuit 131 is able to compare the signal AO1 with the signal AO2, in order to determine whether the equation 1 is satisfied. If the equation 1 is not satisfied, the detector circuit 131 is able to output a corresponding detection signal SD.

Moreover, the digital controller circuit 132 may perform the calibration algorithm (e.g., binary search or successive approximation) in response to the detection signal SD, in order to generate a corresponding calibration signal S1 to control the turn-on time of at least one current source circuit 133A in the DAC circuit 133. In response to the controlled turn-on time, the DAC circuit 133 outputs a corresponding current (e.g., bias current IB1 discussed below) as the compensation signal SR In some embodiments, the compensation signal SP may be directly summed up with the signal AO2, in order to equivalently calibrate the DAC circuit 122, as shown in FIG. 1. In other words, the equation 1 may be amended as ILSB=IMSB+SP (hereinafter referred to as equation 2. Accordingly, by performing the above one or more operations sequentially, the digital controller circuit 132 is able to determine an offset that is required to be calibrated for the single current source circuit 122A, and to record the corresponding calibration signal S1 to a memory (not shown) thereof.

After a corresponding compensation signal SP for the single current source circuit 122A is recorded, the digital controller circuit 132 is able to update the corresponding one bit of the MSB in the testing signal DT to 0, and to update a next one bit of the MSB in the testing signal DT to 1, and then performs the above operations again. With this analogy, the digital controller circuit 132 can store the calibration signals S1, to which all current source circuits 122A correspond, as a look-up table or the like. As a result, when one current source circuit 122A is turned on, the digital controller circuit 132 is able to output a corresponding calibration signal S1, in order to control the DAC circuit 133 to output the corresponding compensation signal SP to calibrate the DAC circuit 122.

In some approaches, considering the layout design and the accuracy, a layout of a normally-on unity current source circuit is employed to implement all current source circuits. For example, a designed normally-on unity current source circuit has a unity current of (⅛)*I. If a current source circuit having a current of (½)*I is desired, four normally-on unity current source circuits connected in parallel with each other can be employed. In these approaches, when the number of bits required for processing is increased, the number of the unity current source circuits is increased, resulting in a higher circuit area of a current-steering DAC. Moreover, as described above, the resolution of the calibration DAC (e.g., the DAC circuit 133) is much higher. In these approaches, larger cell size and layout area are generally required to achieve higher resolution.

Compared with these approaches, in one or more embodiments, a ratio is present between the turn-on time of the current source circuits 121A, 122A, and/or 133A and the period of the system clock signal CLK, and this ratio is able to set the current of various current source circuits 121A, 122A, and/or 133A. For example, if a current source circuit having a unity current I is employed to implement the current source circuit 133A. If the compensation signal SP is determined as Y times of the unity current I, the digital controller circuit 132 may output the calibration signal S1, in order to control the turn-on time of the current source circuit to output the Y times of the unity current I equivalently. In other words, according to different embodiments, at least one of the DAC circuits 121, 122, and/or 133 may utilize the turn-on time of the current source circuit to set the current. As a result, the layout area of the DAC circuit is able to be reduced, and an accurate clock signal can be employed to control current.

For ease of understanding, the signals AO1 and AO2 and the compensation signal SP in FIG. 1 are illustrated in a simplified way. In practical applications, the signal AO1 may be a summation of current (or voltage) signals (e.g., current ILSB) outputted from the DAC circuit 121, the signal AO2 may be a summation of current (or voltage) signals (e.g., current IMSB) outputted from the DAC circuit 122, and the compensation signal SP may be a summation of current signals outputted from the DAC circuit 133. With different types of signals, the detector circuit 131 may employ different circuit configurations to determine whether the equation 1 or 2 is satisfied. For example, if the above signals are current signals, the detector circuit 131 may be implemented with a current comparator and a switching circuit. The switching circuit is for swapping transmitting paths of current signals corresponding to the signals AO1 and AO2, such that the current comparator is able to acquire sufficient information to determine whether the equation 1 or 2 is satisfied.

Figure 3:
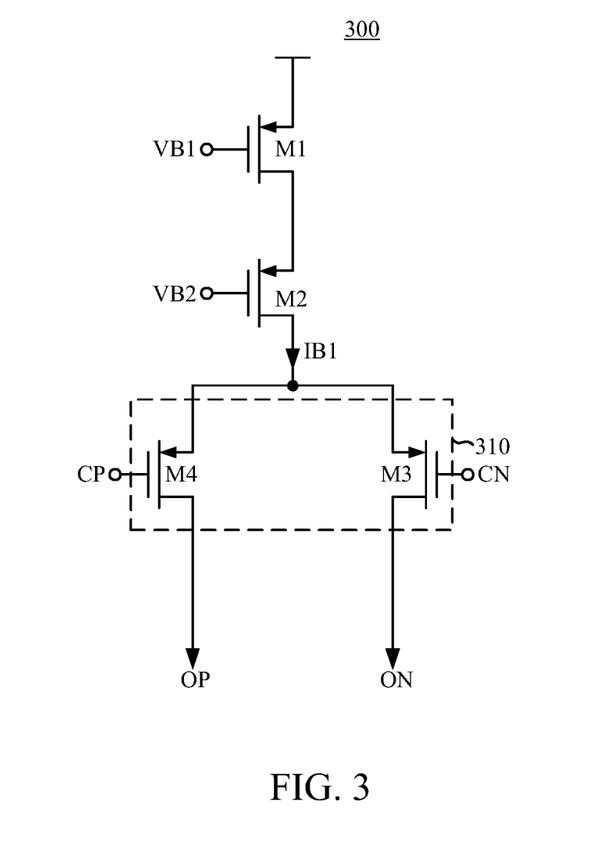
FIG. 3 is a schematic diagram of a current source circuit, according to some embodiments of the present disclosure.

FIG. 3 is a schematic diagram of a current source circuit 300, according to some embodiments of the present disclosure. The current source circuit 300 may be used to implement the current source circuits 121A, 122A, and/or 133A in FIG. 2.

The current source circuit 300 includes transistors M1-M2 and a differential input pair 310. The transistors M1-M2 are coupled in series, and are turned on respectively according to bias signals VB1 and VB2, in order to provide a bias current IB1. For example, in the bias current IB1 may correspond to the unity current I as discussed above.

In some embodiments, the transistors M1-M2 are for increasing an output impedance of the current source circuit 300. The numbers of the transistors M1-M2 are given for illustrative purposes. In different embodiments, only one transistor (e.g., the transistor M1) can be employed to provide the bias current IB1, or more than two transistors can be employed to provide the bias current IB1.

The differential input pair 310 includes transistors M3-M4. First terminals of the transistors M3-M4 are coupled to the transistor M2, in order to receive the bias current IB1. Second terminals of the transistors M3-M4 are coupled to the output terminals ON and OP in FIG. 1, respectively. Control terminals of the transistors M3-M4 receive control signals CN and CP, respectively, in which the control signals CN and CP are complementary to each other. In some embodiments, when the signal CN has a logic value of 0, the signal CP has a logic value of 1, and vice versa. When the signal CN has the logic value of 0, the transistor M3 is turned on, and the transistor M4 is turned off. Under this condition, the bias current IB1 is steered to the output terminal ON. Alternatively, when the signal CN has the logic value of 1, the transistor M4 is turned on, and the transistor M3 is turned off. Under this condition, the bias current IB1 is steered to the output terminal OP. With the above operations, the bias current IB1 may be steered to the different output terminals OP and ON, in order to generate different analog signals (e.g., compensation signal SP, the signal AO1 or AO2). In some embodiments, the control signals CN and CP are voltage signals complementary to each other. When the control signal CN has a low voltage, the control signal CP has a high voltage.

In different embodiments, the bias signals VB1-VB2 or the signals CN and CP may be configured to determine the turn-on time of the current source circuit 300. If the signals CP and CN are employed to control the turn-on time, the signal CP and CN may be associated with bit(s) of one of LSB, MSB, and/or the calibration signal S1. For example, when the current source circuit 300 is employed to implement the DAC circuit 133, the signals CP and CN may be bit(s) of the calibration signal S1 associated with the comparison result.

Figure 4:
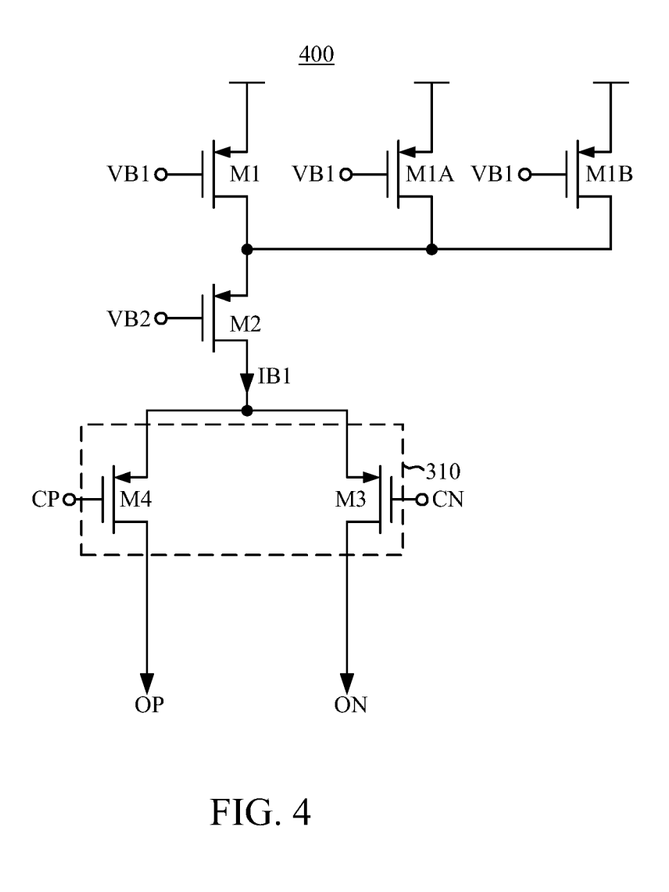
FIG. 4 is a schematic diagram of a current source circuit, according to some embodiments of the present disclosure.

FIG. 4 is a schematic diagram of a current source circuit 400, according to some embodiments of the present disclosure. The current source circuit 400 may be employed to implement the current source circuits 121A, 122A, and/or 133A in FIG. 2.

Compared with FIG. 3, the current source circuit 400 further includes transistors M1A and M1B. The transistors M1, M1A, and M1B are coupled in parallel, and are coupled to the transistor M2. In this example, the transistors M1, M1A, and M1B are configured to be turned on according to the bias signal VB1 to provide the bias current IB1. Compared with FIG. 3, with the transistors M1, M1A, and M1B, a larger bias current IB1 can be obtained. The numbers of the transistors M1, M1A, and M1B are given for illustrative purposes, and the present disclosure is not limited thereto.

The above arrangements of the current source circuit 300 or 400 are given for illustrative purposes, and various arrangements of the current source circuit are able to implement the DAC circuits 121, 122, and/or 133.

Figure 5:
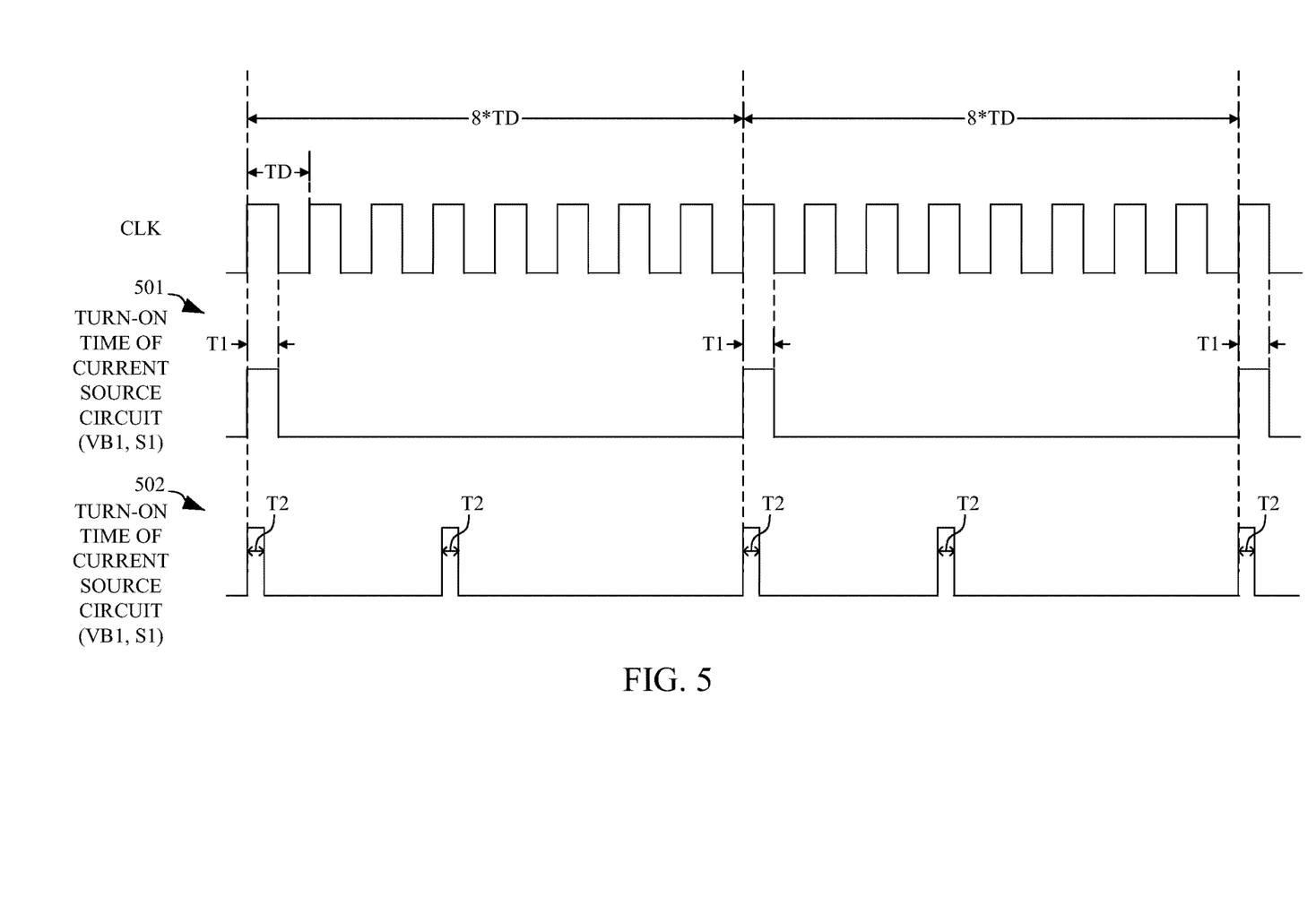
FIG. 5 is a schematic diagram illustrating waveforms of the system clock signal in FIG. 1 and the bias signal or the calibration signal in FIG. 3, according to some embodiments of the present disclosure.

FIG. 5 is a schematic diagram illustrating waveforms of the system clock signal CLK in FIG. 1 and the bias signal VB1 (or VB2) or the calibration signal S1 in FIG. 3, according to some embodiments of the present disclosure.

As shown in FIG. 5, the system clock signal CLK has a period TD. If the current source circuit 300 is configured to be normally on, the bias current IB1 corresponds to the unity current I. If Y times of the unity current I are desired to be set, the turn-on time of the current source circuit 300 is configured to be 0.5*Y times of the period TD.

In some embodiments, the current source circuit 300 can be turned on periodically, in order to determine the current expected to be generated. For example, if a ⅛ times of the unity current I is desired to be set (i.e., Y=⅛), the turn-on time of the current source circuit 300 may be configured to be 1/16 times of the period TD. Equivalently, as shown by a waveform 501, the current source circuit 300 is turned on once every 8 periods TD, in order to generate the current of (⅛)*I. In some embodiments, a turn-on time T1 substantially indicates a time interval when a bit CN (or CP) of the calibration signal S1 has a logic value of 0 (i.e., turning on the transistor M3 or M4). Alternatively, in some embodiments, the turn-on time T1 substantially indicates a time interval when the bias signal VB1 is at the low level (i.e., turning on the transistor M1).

In some embodiments, the current source circuit 300 may be turned on randomly (which may be similar to pseudo randomness binary sequence), in order to determine the current expected to be generated. For example, as shown by a waveform 502, if the ⅛ times of the unity current I is desired to be set (i.e., Y=⅛), the current source circuit 300 may be randomly turned on twice every 8 periods TD, and each turn-on time T2 is 0.5*T1. As a result, in each 8 period TD, the turn-on time (i.e., 2*T2) of the current source circuit 300 also indicates 1/16 times of the period TD.

The waveforms in FIG. 5 are given for illustrative purposes. Various configurations of turn-on time to generate the corresponding current are within the contemplated scope of the present disclosure.

Figure 6:
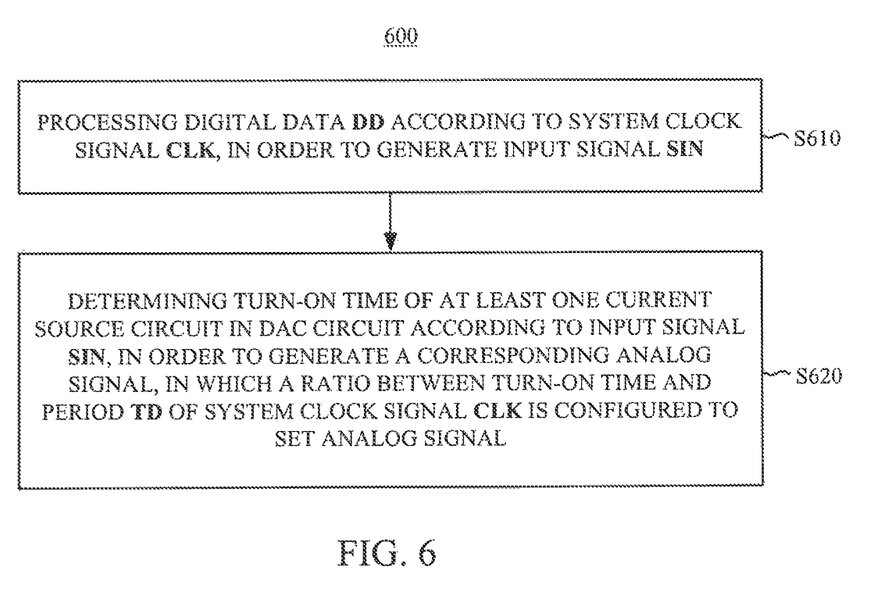
FIG. 6 is a flow chart of a current control method, according to some embodiments of the present disclosure.

FIG. 6 is a flow chart of a current control method 600, according to some embodiments of the present disclosure. In some embodiments, the current control method 600 includes operations S610 and S620.

In operation S610, the digital data DD is processed according to the system clock signal CLK, in order to generate the input signal SIN. For example, as shown in FIG. 1, the codec circuit 112 performs the encoding or decoding operation on the digital data DD according to the system clock signal CLK, in order to generate the input signal SIN.

In operation S620, a turn-on time of at least one current source circuit in DAC circuits is determined according to the input signal SIN, in order to generate a corresponding analog signal, in which a ratio between the turn-on time and the period TD of the system clock signal CLK is configured to set the analog signal.

For example, as described above, the DAC circuit 121, 122, or 133 may be implemented with a current-steering DAC. According to the LSB or the MSB of the input signal SIN or a comparison result of the LSB and MSB (i.e., the detection signal SD), the turn-on time of at least one current source circuit in the DAC circuit 121, 122, or 133 can be determined, in order to output the corresponding currents as the analog signal (e.g., the signal AO1, AO2, or the compensation signal SP). The examples of the turn-on time can be understood with reference to FIG. 5 as discussed above, and the repetitious descriptions are not given herein.

As described above, the DAC device and the current control method provided in embodiments of the present disclosure control the turn-on time of the current source circuit to generate the required current. As a result, the circuit area is saved, and the precision of current is improved.

What is claimed is:

1. A digital-to-analog converter (DAC) device, comprising:
    a DAC circuitry, comprising:
    a first DAC circuit configured to generate a first signal according to a plurality of least significant bits of an input signal, wherein the input signal is generated by processing digital data according to a system clock signal; and
    a second DAC circuit configured to output a second signal according to a plurality of most significant bits of the input signal,
    wherein a ratio is present between a first turn-on time of at least one current source circuit in the first DAC circuit and the system clock signal, and the ratio is configured to set the first signal.

2. The DAC device of claim 1, further comprising:
    a third DAC circuit configured to output a compensation signal according to a comparison result of the first signal and the second signal, in order to calibrate the second DAC circuit,
    wherein a second turn-on time of at least one current source circuit in the third DAC circuit is configured to set the compensation signal.

3. The DAC device of claim 2, wherein the DAC circuitry is configured to operate according to the system clock signal, the system clock signal has a period, and if the compensation signal corresponds to a Y-times of an unity current, the second turn-on time is 0.5*Y times of the period.

4. The DAC device of claim 2, further comprising:
    a detector circuit configured to compare the first signal with the second signal, in order to generate a detection signal that is configured to indicate the comparison result; and
    a digital controller circuit configured to perform a calibration operation according to the detection signal, in order to generate a calibration signal that is configured to set the second turn-on time.

5. The DAC device of claim 2, wherein the at least one current source circuit in the third DAC circuit is randomly turned on.

6. The DAC device of claim 2, wherein the at least one current source circuit in the third DAC circuit is turned on periodically.

7. The DAC device of claim 2, wherein at least one of the first DAC circuit and the third DAC circuit is implemented with a current-steering DAC circuit.

8. The DAC device of claim 2, wherein the at least one current source circuit in the third DAC circuit comprises:
    at least one transistor configured to be turned on according to at least one bias signal, in order to provide a bias current; and
    a differential input pair coupled to the at least one transistor, the differential input pair configured to steer the bias current according to a bit associated with the comparison result, in order to generate the compensation signal.

9. The DAC device of claim 8, wherein the second turn-on time indicates a time interval when the at least one bias signal is at a predetermined level.

10. The DAC device of claim 8, wherein the second turn-on time indicates a time interval when the bit has a predetermined logic value.

11. The DAC device of claim 1, wherein the DAC circuitry is configured to operate according to the system clock signal, the system clock signal has a period, and if the first signal corresponds to a Y-times of an unity current, the first turn-on time is 0.5*Y times of the period.

12. The DAC device of claim 1, wherein the at least one current source circuit comprises:
  at least one transistor configured to be turned on according to at least one bias signal, in order to provide a bias current; and
  a differential input pair coupled to the at least one transistor, the differential input pair configured to steer the bias current according to at least corresponding one of the plurality of least significant bits, in order to generate the first signal.

13. The DAC device of claim 12, wherein the first turn-on time indicates a time interval when the at least one bias signal is at a predetermined level.

14. The DAC device of claim 12, wherein the first turn-on time indicates a time interval when the at least corresponding one of the plurality of least significant bits has a predetermined logic value.

15. The DAC device of claim 1, wherein the at least one current source circuit in the first DAC circuit is turned on periodically or randomly.

16. A current control method, comprising:
  processing digital data according to a system clock signal, in order to generate an input signal; and
  determining a turn-on time of at least one current source circuit in a digital-to-analog converter (DAC) circuit, in order to generate an analog signal,
  wherein a ratio is present between the turn-on time and the system clock signal, and the ratio is configured to set the analog signal.

17. The current control method of claim 16, wherein the system clock signal has a period, and if the analog signal corresponds to a Y-times of an unity current, the turn-on time is 0.5*Y times of the period.

18. The current control method of claim 16, wherein the at least one current source circuit is turned on periodically.

19. The current control method of claim 16, wherein the at least one current source circuit is turned on randomly.

20. A DAC device, comprising:
  a DAC circuitry, comprising:
    a first DAC circuit configured to generate a first signal according to a plurality of least significant bits of an input signal;
    a second DAC circuit configured to output a second signal according to a plurality of most significant bits of the input signal; and
    a third DAC circuit configured to output a compensation signal according to a comparison result of the first signal and the second signal, in order to calibrate the second DAC circuit,
  wherein a first turn-on time of at least one current source circuit in the first DAC circuit is configured to set the first signal, and a second turn-on time of at least one current source circuit in the third DAC circuit is configured to set the compensation signal.

* * * * *